United States Patent
Taniguchi et al.

(10) Patent No.: US 10,374,304 B2
(45) Date of Patent: Aug. 6, 2019

(54) ELECTRONIC APPARATUS AND ANTENNA DEVICE

(71) Applicant: Murata Manufacturing Co., Ltd., Nagaokakyo-shi, Kyoto-fu (JP)

(72) Inventors: Katsumi Taniguchi, Nagaokakyo (JP); Noboru Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 175 days.

(21) Appl. No.: 15/618,223

(22) Filed: Jun. 9, 2017

(65) Prior Publication Data

US 2017/0279192 A1    Sep. 28, 2017

Related U.S. Application Data

(63) Continuation of application No. PCT/JP2016/062586, filed on Apr. 21, 2016.

(30) Foreign Application Priority Data

Jun. 16, 2015    (JP) .................................. 2015-121034

(51) Int. Cl.
*H01Q 1/52*        (2006.01)
*H01Q 1/38*        (2006.01)
(Continued)

(52) U.S. Cl.
CPC ............... *H01Q 1/52* (2013.01); *H01P 3/085* (2013.01); *H01Q 1/243* (2013.01); *H01Q 1/38* (2013.01);
(Continued)

(58) Field of Classification Search
CPC .................... H01Q 1/52; H01Q 1/243; H01Q 1/38; H01Q 1/48; H01Q 9/0421; H01P 3/085;
(Continued)

(56) References Cited

U.S. PATENT DOCUMENTS

2015/0048979 A1* 2/2015 Asrani ................... H01Q 1/243
343/702

FOREIGN PATENT DOCUMENTS

EP    2 128 924 A1    12/2009
JP    11-177327 A    7/1999
(Continued)

OTHER PUBLICATIONS

Official Communication issued in International Patent Application No. PCT/JP2016/062586, dated Jul. 19, 2016.

*Primary Examiner* — Dameon E Levi
*Assistant Examiner* — David E Lotter
(74) *Attorney, Agent, or Firm* — Keating & Bennett, LLP

(57) ABSTRACT

An electronic apparatus includes an antenna device, a circuit board, and a housing containing the antenna device and the circuit board. The inner surface of the housing is spaced apart from the circuit board. The antenna device includes an antenna unit, a matching circuit unit connected to the antenna unit, a transmission line unit connected to the matching circuit unit, and a connecting portion included in the transmission line unit. The antenna device is disposed along the inner surface of the housing. The connecting portion is connected to a circuit of the circuit board. The antenna device includes a ground connection portion in the matching circuit unit in a region where the antenna device is disposed along the inner surface of the housing. The ground connection portion electrically connects a second ground conductor of the antenna device to a first ground conductor on the housing.

19 Claims, 13 Drawing Sheets

(51) Int. Cl.
  *H01P 3/08* (2006.01)
  *H01Q 1/48* (2006.01)
  *H03H 7/38* (2006.01)
  *H05K 1/02* (2006.01)
  *H01Q 1/24* (2006.01)
  *H04B 1/04* (2006.01)
(52) U.S. Cl.
  CPC ............... *H01Q 1/48* (2013.01); *H03H 7/38* (2013.01); *H04B 1/0458* (2013.01); *H05K 1/028* (2013.01); *H05K 1/0216* (2013.01)
(58) Field of Classification Search
  CPC ...... H03H 7/38; H04B 1/0458; H05K 1/0216; H05K 1/028
  See application file for complete search history.

(56) References Cited

FOREIGN PATENT DOCUMENTS

| | | |
|---|---|---|
| JP | 2009-290270 A | 12/2009 |
| JP | 2012-231386 A | 11/2012 |
| JP | 2014-060544 A | 4/2014 |

* cited by examiner

ELECTRONIC APPARATUS AND ANTENNA DEVICE

CROSS REFERENCE TO RELATED APPLICATIONS

This application claims the benefit of priority to Japanese Patent Application No. 2015-121034 filed on Jun. 16, 2015 and is a Continuation Application of PCT Application No. PCT/JP2016/062586 filed on Apr. 21, 2016. The entire contents of each application are hereby incorporated herein by reference.

BACKGROUND OF THE INVENTION

1. Field of the Invention

The present invention relates to an antenna device and an electronic apparatus, and particularly relates to, for example, an antenna device including an antenna unit, a matching circuit unit, a transmission line unit, and a connecting portion and an electronic apparatus including the antenna device.

2. Description of the Related Art

In electronic apparatuses (such as mobile devices, for example) having a housing which contains an antenna and a circuit board, a structure in which the antenna is attached to the inner surface of the housing and a conductor on the circuit board is connected to the antenna by a spring pin or the like, is known.

For example, Japanese Unexamined Patent Application Publication No. 2012-231386 discloses a communication apparatus having a housing which contains an antenna and a circuit board. The communication apparatus has a configuration in which the antenna disposed on the inner surface of the housing is connected to a conductor on the circuit board by a connecting member, such as a spring pin.

With the recent miniaturization and sophistication of electronic apparatuses, it has become difficult to create sufficient space, in a housing of an electronic apparatus, for arranging a matching circuit and a transmission line or the like.

In the configuration disclosed in Japanese Unexamined Patent Application Publication No. 2012-231386, a matching circuit and other components of the antenna are mounted on the circuit board of small size. Therefore, the degree of freedom in designing the arrangement of the matching circuit and other components is lowered. Also, as described above, the conductor on the circuit board is connected to the antenna by the connecting member, such as a spring pin. This not only causes a loss in the connecting member, but also makes it difficult to achieve impedance matching because the length of a line between the antenna and the matching circuit is long. Moreover, since a conductive pattern of the antenna and the connecting member, such as a spring pin, are close to each other, stray capacitance between the conductive pattern and the connecting member is formed therebetween. This leads to degraded antenna characteristics, or causes changes from original antenna characteristics after the antenna is mounted onto the housing.

SUMMARY OF THE INVENTION

Preferred embodiments of the present invention provide a low-loss antenna device with a simple configuration, and an electronic apparatus including the antenna device. In addition, preferred embodiments of the present invention provide an antenna device with good antenna characteristics and an electronic apparatus including the antenna device.

An electronic apparatus according to a preferred embodiment of the present invention is an electronic apparatus including an antenna device, a circuit board including a circuit, and a housing containing the antenna device and the circuit board. In the electronic apparatus, there is a distance between an inner surface of the housing and the circuit board. The housing includes a first ground conductor thereon. The antenna device includes an antenna unit, a matching circuit unit connected to the antenna unit, a transmission line unit connected to the matching circuit unit, and a connecting portion included in the transmission line unit and connected to the circuit. The antenna unit, the matching circuit unit, the transmission line unit, and the connecting portion are disposed in a single substrate. The antenna device is at least partly disposed along the inner surface of the housing. At least one of the matching circuit unit and the transmission line unit includes a second ground conductor, and includes a ground connection portion at least in a portion of a surface of a region where the antenna device is disposed along the inner surface of the housing, the ground connection portion electrically connecting the second ground conductor to the first ground conductor.

According to the configuration described above, at least a portion of the matching circuit unit and the transmission line unit includes the ground connection portion electrically connected to the ground conductor of the housing. Therefore, the ground potential of the ground conductor of the antenna device is stabilized. It is thus possible to significantly reduce or prevent changes in characteristics in the matching circuit unit, or enhance a shielding effect in the transmission line unit.

According to the configuration described above, where the antenna unit, the matching circuit unit, the transmission line unit, and the connecting portion are combined into and able to be handled as a single component, the antenna device is able to be mounted easily. Also, this configuration eliminates the need for forming a line between the antenna unit and the connecting portion on the circuit board.

Preferably, the substrate is flexible at least in an area where the antenna unit is disposed, and the antenna unit is located along the inner surface of the housing in a bent state, for example. This configuration allows the antenna unit to be located in a small space inside the housing.

Preferably, the substrate is flexible at least in the vicinity of the connecting portion, and the transmission line unit is bent in the vicinity of the connecting portion, for example. According to this configuration, where the transmission line unit is flexible in the vicinity of the connecting portion, the connecting portion is able to be easily connected to the circuit of the circuit board. By bending the transmission line unit in the vicinity of the connecting portion, the connecting portion of the antenna device and the circuit of the circuit board, which are located at different heights, are able to be connected without use of a spring pin or the like.

Preferably, the antenna device is disposed along the inner surface of the housing, except in the vicinity of the connecting portion, and is connected to the circuit of the circuit board only at the connecting portion, for example. According to this configuration, where the transmission line unit and the circuit board are spaced apart except in the vicinity of the connecting portion, it is possible to significantly reduce or prevent radiation of noise from the transmission line unit to the circuit board. Additionally, since there is no need to place the antenna device to fit the uneven contour of surface mount components on the circuit board, the antenna device is able to be easily mounted inside the housing.

An antenna device according to another preferred embodiment of the present invention is an antenna device disposed on an inner surface of a housing of an electronic apparatus. The antenna device includes an antenna unit, a matching circuit unit connected to the antenna unit, a transmission line unit connected to the matching circuit unit, and a connecting portion included in the transmission line unit and connected to a circuit board of the electronic apparatus. The antenna unit, the matching circuit unit, the transmission line unit, and the connecting portion are disposed in a single substrate. At least one of the matching circuit unit and the transmission line unit includes a ground conductor and includes, on a surface thereof, a ground connection portion electrically connected to the ground conductor.

According to the configuration described above, there is no need to connect a conductor on the circuit board and the antenna by a connecting member, for example, a spring pin, and an antenna device in which degradation of antenna characteristics is significantly reduced or prevented is able to be provided. Also, according to this configuration, an antenna device with good antenna characteristics is able to be provided, in which a line between the antenna and the matching circuit is short and impedance matching is easily achieved.

The preferred embodiments of the present invention are able to provide a low-loss antenna device with a simple configuration, and an electronic apparatus including the antenna device. The preferred embodiments of the present invention are also able to provide an antenna device with good antenna characteristics, and an electronic apparatus including the antenna device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
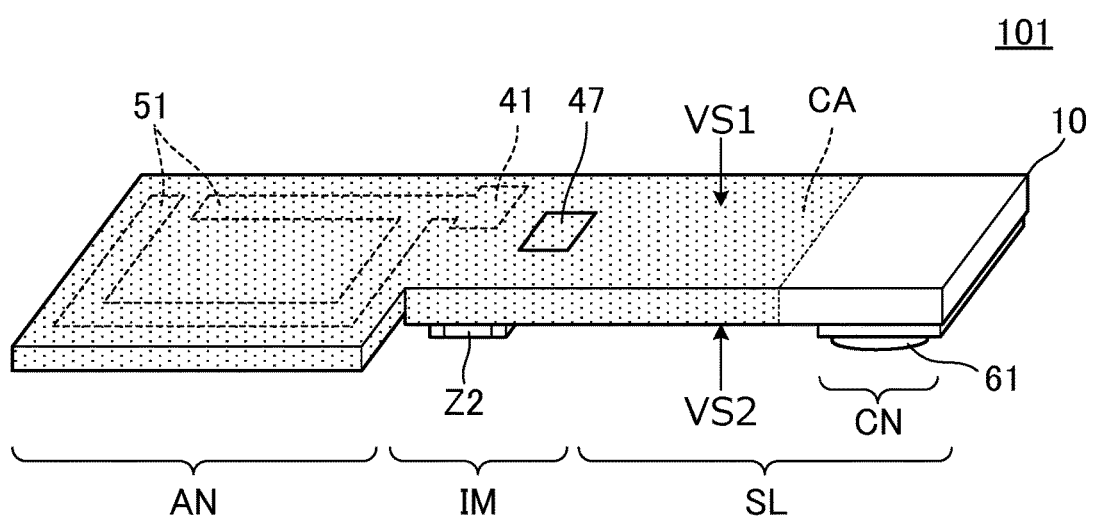
FIG. 1 is an external perspective view of an antenna device 101 according to a first preferred embodiment of the present invention.

Hereinafter, a plurality of preferred embodiments of the present invention will be described with reference to the attached drawings and several specific examples. In the drawings, components and elements assigned with the same reference numerals or symbols will represent identical components and elements. Elements and features of different preferred embodiments are able to be partially replaced and combined with each other.

First Preferred Embodiment

Figure 2:
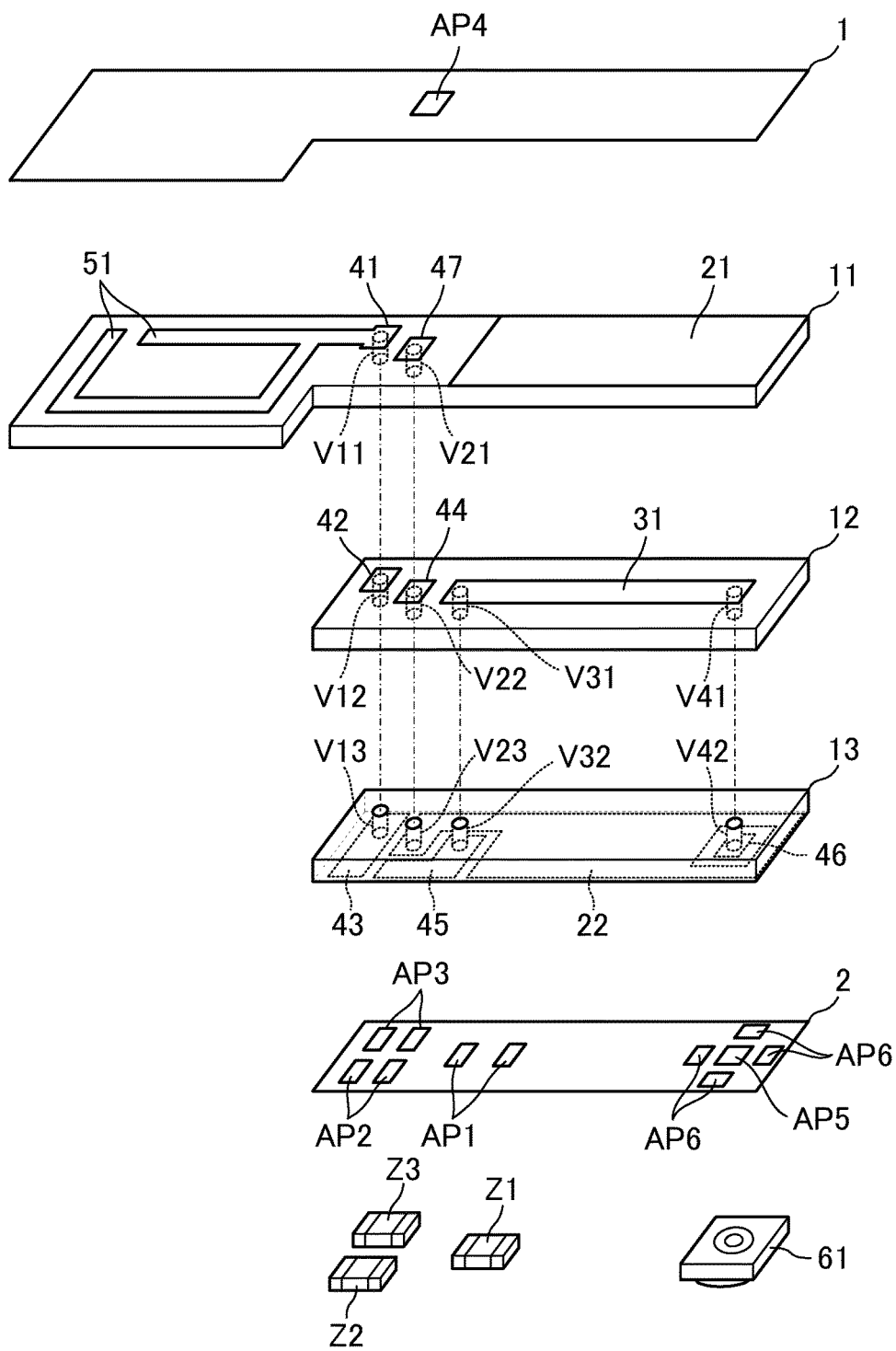
FIG. 2 is an exploded perspective view of the antenna device 101 according to the first preferred embodiment of the present invention.
Figure 3:
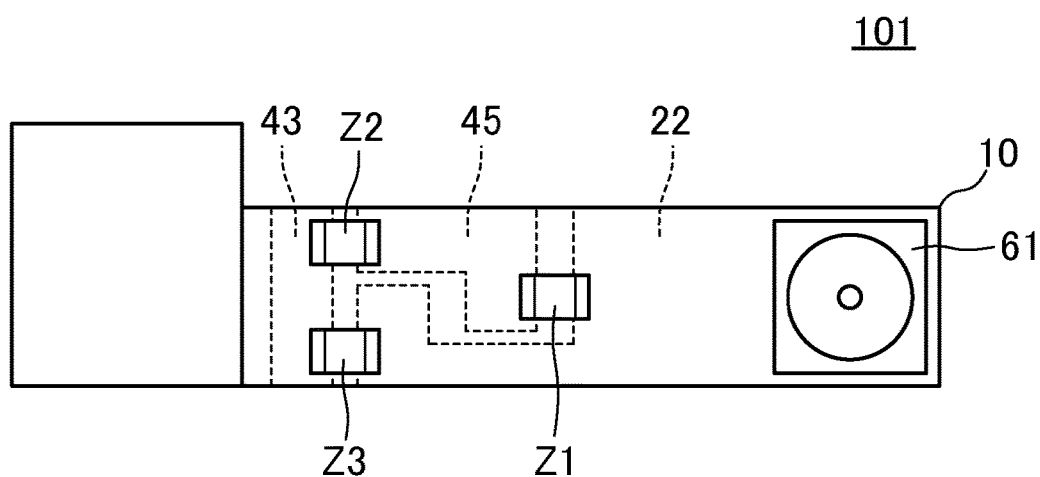
FIG. 3 shows a back side of the antenna device 101 according to the first preferred embodiment of the present invention.
Figure 4:
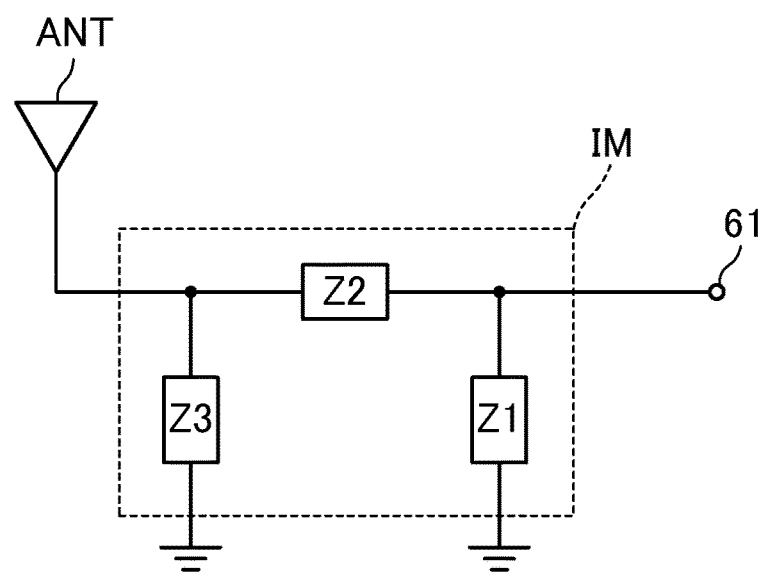
FIG. 4 is a circuit diagram of the antenna device 101 according to the first preferred embodiment of the present invention.

FIG. 1 is an external perspective view of an antenna device 101 according to a first preferred embodiment of the present invention. FIG. 2 is an exploded perspective view of the antenna device 101. FIG. 3 shows a back side of the antenna device 101. The antenna device 101 according to the present preferred embodiment is an antenna device disposed along an inner surface of a housing. FIG. 4 is a circuit diagram of the antenna device 101 according to the first preferred embodiment. In FIG. 4, an antenna conductor 51 (antenna unit AN) is represented by an antenna ANT.

As shown in FIG. 1, the antenna device 101 includes the antenna unit AN, a matching circuit unit IM, a transmission line unit SL, and a connecting portion CN. The antenna unit AN, the matching circuit unit IM, the transmission line unit SL, and the connecting portion CN are arranged in this order in the longitudinal direction of the antenna device 101. The matching circuit unit IM is connected to both the antenna unit AN and the transmission line unit SL. The connecting portion CN is included in the transmission line unit SL.

Specifically, the antenna device 101 includes a substrate 10, reactance elements Z1, Z2, and Z3, and a connector 61. The reactance elements Z1, Z2, and Z3 are, for example, chip inductors, chip capacitors, or chip jumper elements (low-resistance chip resistors). In the present preferred embodiment, the connector 61 defines a "connecting portion".

The substrate 10 is a substantially long, flat, insulating plate with flexibility. The substrate 10 includes a first principal surface VS1 and a second principal surface VS2 opposite to each other. The reactance elements Z1, Z2, and Z3 and the connector 61 are mounted on the second principal surface VS2 of the substrate 10. That is, the antenna unit AN, the matching circuit unit IM, the transmission line unit SL, and the connecting portion CN are integrally disposed in the substrate 10 as shown in FIG. 1.

As shown in FIG. 2, the substrate 10 includes a multilayer structure including a protective layer 1, a resin base layer 11, a resin base layer 12, a resin base layer 13, and a protective layer 2. The protective layer 1 is the uppermost layer and the protective layer 2 is the lowermost layer in FIG. 2. The resin base layers 11, 12, and 13 are resin layers, for example, polyimide (PI) layers, liquid-crystal polymer (LCP) layers, or the like. The protective layers 1 and 2 are, for example, resist layers, coverlay films, or the like. Note that the protective layers 1 and 2 are not essential, and do not necessarily need to be included in the substrate 10.

The resin base layer 11 is a substantially long, flat, flexible plate. The antenna conductor 51, a conductor 41, a ground connection portion 47, and a second ground conductor 21 are provided on the upper surface (for example, the front surface shown in FIG. 2) of the resin base layer 11. The antenna conductor 51 preferably is a C-shaped or substantially C-shaped conductive pattern provided near a second end portion (for example, a left end portion of FIG. 2) of the resin base layer 11 in the longitudinal direction. The antenna conductor 51 is connected at one end thereof to the conductor 41. The conductor 41 is a rectangular or substantially rectangular conductive pattern located closer to the second end portion of the resin base layer 11 than the center of the resin base layer 11 in the longitudinal direction. The second ground conductor 21 is a conductive pattern provided on substantially the entire surface of an area extending from the center to a first end portion (for example, a right end portion of FIG. 2) of the resin base layer 11 in the longitudinal direction. The antenna conductor 51 is, for example, a radiating element of an ultra-high frequency (UHF) antenna.

The protective layer 1 includes the same or substantially the same shape in plan view as the resin base layer 11, and is provided on the upper surface of the resin base layer 11. The protective layer 1 includes an opening AP4 corresponding to the position where the ground connection portion 47 is located. Therefore, the protective layer 1 is provided on the upper surface of the resin base layer 11, so that the ground connection portion 47 is exposed on the first principal surface VS1 of the substrate 10.

The resin base layer 12 is a long, flat, flexible plate. Conductors 42 and 44, which define and function as relaying elements, and a signal conductor 31 are provided on the upper surface (for example, the front surface shown in FIG. 2) of the resin base layer 12. The signal conductor 31 is a conductive pattern extending in the longitudinal direction of the resin base layer 12. The conductors 42 and 44 are rectangular or substantially rectangular conductive patterns provided near a first end portion (for example, the left end portion of FIG. 2) of the resin base layer 12 in the longitudinal direction. The conductor 42 is connected to the conductor 41 by an interlayer connection conductor V11. The conductor 44 is connected to the ground connection portion 47 by an interlayer connection conductor V21. The interlayer connection conductors are, for example, via conductors or through holes or the like.

The resin base layer 13 is a long, flat, flexible plate. Conductors 43 and 45, a second ground conductor 22, and a connection electrode 46 are provided on the lower surface (for example, the back surface shown in FIG. 2) of the resin base layer 13.

The conductor 43 is a rectangular or substantially rectangular conductive pattern provided near a first end portion (for example, the left end portion of FIG. 2) of the resin base layer 13 in the longitudinal direction. The conductor 43 is connected to the conductor 42 by an interlayer connection conductor V13 and an interlayer connection conductor V12. That is, the conductor 43 is electrically connected to the antenna conductor 51. The conductor 45 is an L-shaped or substantially L-shaped conductive pattern located closer to the first end portion of the resin base layer 13 than the center of the resin base layer 13 in the longitudinal direction. The conductor 45 is connected to one end of the signal conductor 31 by an interlayer connection conductor V32 and an interlayer connection conductor V31. The connection electrode 46 is a rectangular or substantially rectangular conductive pattern provided near a second end portion (for example, the right end portion of FIG. 2) of the resin base layer 13 in the longitudinal direction. The connection electrode 46 is connected to the other end of the signal conductor 31 by an interlayer connection conductor V42 and an interlayer connection conductor V41. The second ground conductor 22 is a conductive pattern with an opening at the position where the connection electrode 46 is provided.

One end of the second ground conductor 22 is connected to the conductor 44 by an interlayer connection conductor V23 and an interlayer connection conductor V22. As described above, the conductor 44 is connected to the ground connection portion 47 by the interlayer connection conductor V21. Thus, the ground connection portion 47 is electrically connected to the second ground conductor 22.

The protective layer 2 preferably has the same or substantially the same shape in plan view as the resin base layer 13, and is provided on the lower surface of the resin base layer 13.

The protective layer 2 preferably includes an opening AP5 corresponding to the position where the connection electrode 46 is provided, and further includes four openings AP6 corresponding to the position where the second ground conductor 22 is located, for example. Therefore, the protective layer 2 is provided on the lower surface of the resin base layer 13, so that the connection electrode 46 and a portion of the second ground conductor 22 are exposed on the second principal surface VS2 of the substrate 10. As shown in FIG. 2, the connector 61 is mounted on the second principal surface VS2 of the substrate 10, so that the connector 61 is connected to the connection electrode 46 and the second ground conductor 22. That is, the connector 61 is electrically connected to the signal conductor 31 and the second ground conductor 22.

The protective layer 2 includes two openings AP1 corresponding to the mounting position of the reactance element Z1 connected between the conductor 45 and the second ground conductor 22. Therefore, the protective layer 2 is provided on the lower surface of the resin base layer 13, so that a portion of the conductor 45 and a portion of the second ground conductor 22 are exposed on the second principal surface VS2 of the substrate 10. As shown in FIG. 3, the reactance element Z1 is mounted on the second principal surface VS2 of the substrate 10, so that the reactance element Z1 is connected between the conductor 45 and the second ground conductor 22.

The protective layer 2 includes two openings AP2 corresponding to the mounting position of the reactance element Z2 connected between the conductor 43 and the conductor 45. Therefore, the protective layer 2 is provided on the lower surface of the resin base layer 13, so that a portion of the conductor 43 and a portion of the conductor 45 are exposed on the second principal surface VS2 of the substrate 10. As shown in FIG. 3, the reactance element Z2 is mounted on the second principal surface VS2 of the substrate 10, so that the reactance element Z2 is connected between the conductor 43 and the conductor 45.

The protective layer 2 includes two openings AP3 corresponding to the mounting position of the reactance element Z3 connected between the conductor 43 and the second ground conductor 22. Therefore the protective layer 2 is provided on the lower surface of the resin base layer 13, so that a portion of the conductor 43 and a portion of the second ground conductor 22 are exposed on the second principal surface VS2 of the substrate 10. As shown in FIG. 3, the reactance element Z3 is mounted on the second principal surface VS2 of the substrate 10, so that the reactance element Z3 is connected between the conductor 43 and the second ground conductor 22.

As described above, the antenna device 101 includes the antenna unit AN, the matching circuit unit IM, the transmission line unit SL, and the connecting portion CN. The antenna unit AN, the matching circuit unit IM, the transmission line unit SL, and the connecting portion CN are arranged in this order in the longitudinal direction of the substrate 10, and are integrally disposed in the substrate 10.

The antenna unit AN includes the antenna conductor 51. The matching circuit unit IM includes the conductors 41, 42, 43, 44, and 45, the second ground conductor 22, the interlayer connection conductors V11, V12, V13, V21, V22, V23, V31, and V32, and the reactance elements Z1, Z2, and Z3. That is, the matching circuit unit IM includes the second ground conductor 22. As shown in FIG. 4, the matching circuit unit IM preferably is a π-shaped or substantially π-shaped circuit including the reactance elements Z1, Z2, and Z3. With the matching circuit unit IM, it is possible to achieve impedance matching between a feed circuit and the antenna unit AN and set the frequency characteristics of the antenna.

A region CA (shaded with dots in FIG. 1) is a region where the antenna device 101 is disposed along the inner surface of a housing 91 (see FIG. 5), as described below. The matching circuit unit IM includes the ground connection portion 47 on the front surface of the region CA. As described below, the ground connection portion 47 electrically connects the second ground conductor 22 to a first ground conductor 92 (see FIG. 5) on the housing 91.

The transmission line unit SL includes the second ground conductors 21 and 22. As shown in FIG. 2, the transmission line unit SL preferably has a triplate stripline structure in which the signal conductor 31 is sandwiched between the second ground conductors 21 and 22.

The antenna device 101 is preferably manufactured as described below.

(1) First, the resin base layers 11, 12, and 13, in a collective substrate state, are laminated with metal foil (for example, copper foil) on one side principal surface thereof. The antenna conductor 51, the signal conductor 31, the second ground conductors 21 and 22, the conductors 41, 42, 43, 44, and 45, the ground connection portion 47, and the connection electrode 46 are formed by patterning the metal foil by photolithography. Additionally, the interlayer connection conductors V11, V12, V13, V21, V22, V23, V31, V32, V41, and V42 are formed in the resin base layers 11, 12, and 13 in a collective substrate state. The interlayer connection conductors are formed by making through holes by laser or the like, placing a conductive paste containing at least one of copper, silver, tin, or the like in the through holes, and then hardening the conductive paste by a process of applying heat and pressure. The resin base layers 11, 12, and 13 include a thermoplastic resin base material, for example, liquid-crystal polymer or the like.

(2) The substrate 10, in a collective substrate state, is formed by stacking the resin base layers 11, 12, and 13 and press-bonding while solidifying the conductive paste under heat and pressure.

(3) The protective layers 1 and 2 are formed by printing on the respective surfaces of the substrate 10. For example, the protective layers 1 and 2 are resist layers which are able to be formed by printing with a paste material. Films of a resin base material, for example, polyimide (PI), liquid-crystal polymer (LCP), or the like, may be included as the protective layers 1 and 2.

(4) The connector 61 is connected (joined) to the connection electrode 46 exposed on the second principal surface VS2 of the substrate 10. The reactance element Z1 is connected (joined) to the conductor 45 and the second ground conductor 22 exposed on the second principal surface VS2 of the substrate 10. The reactance element Z2 is connected (joined) to the conductor 43 and the conductor 45 exposed on the second principal surface VS2 of the substrate 10. The reactance element Z3 is connected (joined) to the conductor 43 and the second ground conductor 22 exposed on the second principal surface VS2 of the substrate 10. Each of the connection (joining) operations described above is able to be performed with solder, a conductive adhesive, or the like.

(5) Then, each antenna devices 101 are obtained by dividing the substrate 10 in a collective substrate state. Note that the steps (4) and (5) may be performed in reverse order.

Figure 5:
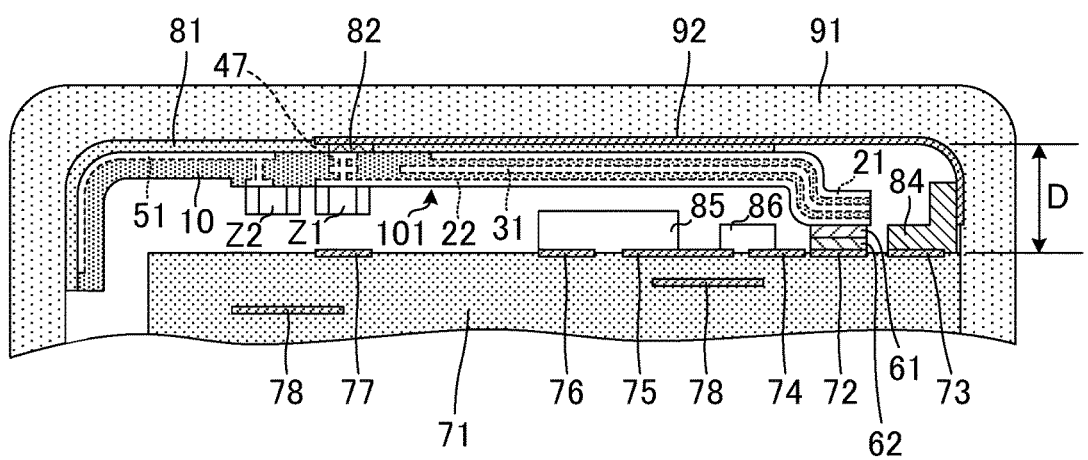
FIG. 5 is a cross-sectional view of a main portion of an electronic apparatus according to the first preferred embodiment of the present invention.

An electronic apparatus including the antenna device 101 is described below with reference to the drawings. FIG. 5 is a cross-sectional view of a main portion of an electronic apparatus according to the first preferred embodiment. In FIG. 5, the thickness of each portion is exaggerated for clarity of illustration. The cross-sectional views in other preferred embodiments of the present invention include similar exaggerated elements for clarity of illustration.

The electronic apparatus according to the present preferred embodiment includes the antenna device 101, surface mount components 85 and 86, a circuit board 71, and the housing 91. The electronic apparatus is, for example, a mobile communication apparatus. The antenna device 101 and the circuit board 71 are contained in the housing 91. For example, the housing 91 is a resin housing with the first ground conductor 92 provided on the inner surface thereof, and the circuit board 71 is a multilayer printed wiring board.

As shown in FIG. 5, in the electronic apparatus according to the present preferred embodiment, there is a distance D between the inner surface of the housing 91 and the circuit board 71. The antenna device 101 is attached to the inner surface of the housing 91 on the first principal surface of the substrate 10, with the second principal surface of the substrate 10 facing toward the interior of the housing 91 (for example, toward the circuit board 71). Specifically, the first principal surface of the substrate 10 of the antenna device 101 is attached to the inner surface of the housing 91, with an adhesive member 81 and a conductive member 82 interposed therebetween. The antenna device 101 is disposed along the inner surface of the housing 91, except in the vicinity of the connector 61 (connecting portion CN in FIG. 1). The adhesive member 81 is, for example, a nonconductive adhesive or a nonconductive double-sided tape. The conductive member 82 is, for example, a conductive double-sided tape. Solder or conductive resin joint material may be included as the conductive member 82.

The substrate 10 of the antenna device 101 is flexible, and the antenna unit AN (antenna conductor 51) is arranged along the inner surface of the housing 91 in a bent state. The ground connection portion 47, which is exposed on the first principal surface VS1 of the substrate 10, is connected to the first ground conductor 92 on the housing 91 by the conductive member 82. The ground connection portion 47 is electrically connected to the second ground conductor 22. That is, the second ground conductor 22 is electrically connected to the first ground conductor 92 via the ground connection portion 47.

The surface mount components 85 and 86 are mounted on a principal surface (for example, the upper surface shown in FIG. 5) of the circuit board 71.

A conductor 72, on which receptacle 62 is disposed, and conductors 73, 74, 75, 76, and 77 are formed on the principal surface of the circuit board 71, and an inner conductor 78 is formed inside the circuit board 71, which includes a feed circuit. The conductor 72 is, for example, a conductive pattern connected to the feed circuit of the circuit board 71. The receptacle 62 is a mount component electrically connected to the conductor 72, with a conductive joint material (not shown) interposed therebetween. The conductor 73 is, for example, a conductive pattern connected to the ground of the circuit board 71. The conductor 73 is connected to the first ground conductor 92 on the inner surface of the housing 91 by a connection conductor 84. The connection conductor 84 is a metal member with an L-shaped or substantially L-shaped cross section. The conductors 74, 75, and 76 are conductive patterns connected to the surface mount components 85 and 86.

The connector 61 of the antenna device 101 is brought into mechanical contact with the receptacle 62. In the electronic apparatus of the present preferred embodiment, where the substrate 10 is flexible, the transmission line unit SL is bent in the vicinity of the connector 61 (connecting portion CN) to connect the connector 61 and the receptacle 62.

Figure 6:
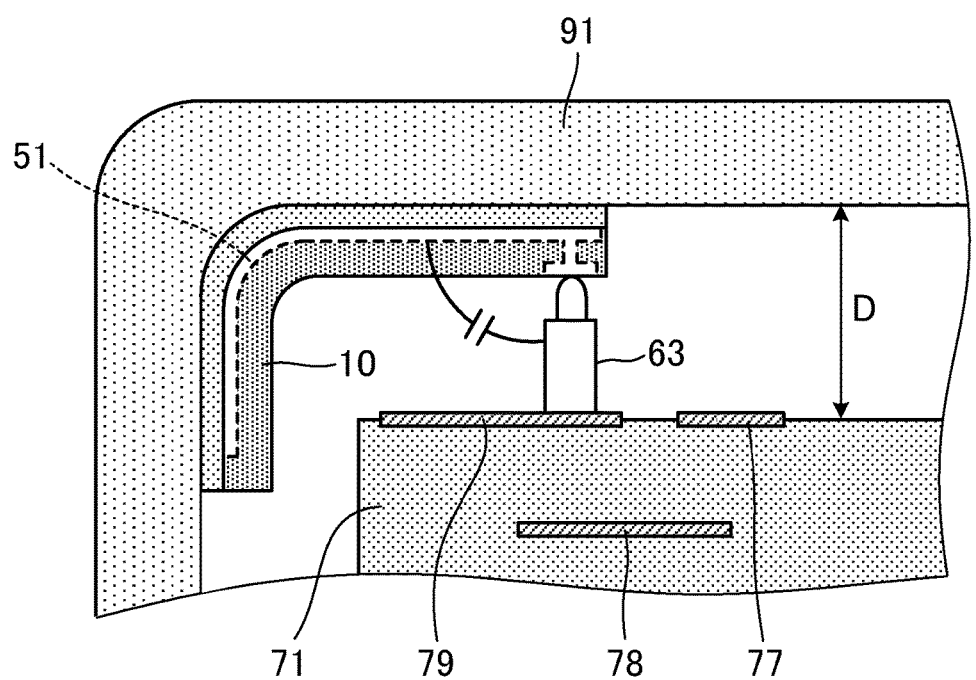
FIG. 6 is an enlarged cross-sectional view of a main portion of an electronic apparatus according to a comparative example.

As a comparative example, an electronic apparatus is described below that includes a configuration in which a conductor provided on a circuit board is connected to an antenna by, for example, a spring pin or the like. FIG. 6 is an enlarged cross-sectional view of a main portion of the electronic apparatus according to the comparative example.

In the electronic apparatus according to the comparative example, only the antenna unit (antenna conductor 51) is attached on the inner surface of the housing 91, and the matching circuit unit and the transmission line unit are disposed on the circuit board 71. The conductor 79 on the circuit board 71 and the antenna conductor 51 are connected by a connecting member 63. The connecting member 63 is a mount component electrically connected to the conductor 79, with a conductive joint material (not shown) interposed therebetween. The connecting member 63 is, for example, a spring pin.

As shown in FIG. 6, in the electronic apparatus according to the comparative example, since the connecting member 63 and the antenna conductor 51 are close to each other, stray capacitance is generated between the connecting member 63 and the antenna conductor 51. The stray capacitance degrades antenna characteristics in the electronic apparatus according to the comparative example.

On the other hand, in the electronic apparatus according to the present preferred embodiment, the antenna unit AN, the matching circuit unit IM, the transmission line unit SL, and the connecting portion CN are integrally disposed in the substrate 10. That is, since the connecting member that connects between the conductor located on the circuit board 71 and the antenna conductor 51 is not located in the vicinity of the antenna conductor 51, stray capacitance between the connecting member and the antenna conductor 51 is able to be significantly reduced or prevented.

The phrase "the connecting member and the antenna conductor are close to each other" in the preferred embodiments of the present invention refers not only to the case where the antenna conductor 51 and the connecting member 63 are disposed very close to each other. The connecting member and the antenna conductor are referred to as being "close" when, for example, the distance between the connecting member 63 and the antenna conductor 51 is less than or equal to the distance D between the inner surface of the housing 91 and the circuit board 71.

The electronic apparatus according to the present preferred embodiment provides the following advantageous effects.

In the electronic apparatus according to the present preferred embodiment, there is no need to connect the conductor on the circuit board 71 to the antenna unit AN with a connecting member, for example, a spring pin or the like. Thus, an electronic apparatus including a low-loss antenna device where degradation of antenna characteristics is significantly reduced or prevented is able to be provided. Furthermore, since a line between the antenna unit AN and the matching circuit unit IM is short, impedance matching is easily achieved and an electronic apparatus including the antenna device 101 with good antenna characteristics is able to be provided.

Since the antenna unit AN, the matching circuit unit IM, the transmission line unit SL, and the connecting portion CN are integrally disposed in the single substrate 10, the antenna device 101 is able to be handled as a single component. Therefore, the antenna device 101 is able to be easily mounted. Furthermore, a line between the antenna unit AN and the connecting portion CN does not need to be on the circuit board 71.

(c) Since the antenna unit AN, the matching circuit unit IM, the transmission line unit SL, and the connecting portion CN are integrally disposed in the single substrate 10, there is no need to connect the conductor on the circuit board 71 to the antenna conductor 51 by a connecting member. Thus, stray capacitance between the connecting member and the antenna conductor 51 is able to be significantly reduced or prevented. In the electronic apparatus according to the present preferred embodiment, the antenna conductor 51 is in a bent state, and the conductor on the circuit board 71 and the antenna conductor 51 are not close to each other. Therefore, a stray capacitance is not generated between the conductor on the circuit board 71 and the antenna conductor 51.

The substrate 10 of the antenna device 101 according to the present preferred embodiment is flexible, and the antenna unit AN, in a bent state, is provided along the inner surface of the housing 91. Thus, the antenna unit AN is able to be located in a small space inside the housing 91.

In the antenna device 101 according to the present preferred embodiment, the transmission line unit SL is flexible in the vicinity of the connector 61 (connecting portion CN). Thus, the connector 61 (connecting portion CN) is able to be connected to a receptacle 62 (a circuit of the circuit board 71). By bending the transmission line unit SL, the connector 61 (connecting portion CN) and the receptacle 62 (the circuit of the circuit board 71), which are located at different heights, are able to be connected without use of a spring pin or the like.

In the electronic apparatus according to the present preferred embodiment, the antenna device 101 is disposed along the inner surface of the housing 91, except in the vicinity of the connector 61 (connecting portion CN). The antenna device 101 is connected to the circuit board 71 (receptacle 62) only at the connector 61 (connecting portion CN). With this configuration, where the transmission line unit SL and the circuit board 71 are spaced apart except in the vicinity of the connector 61 (connecting portion CN), radiation of noise from the transmission line unit SL to the circuit board 71 is able to be significantly reduced or prevented. Since there is no need to place the antenna device 101 to fit the uneven contour of the surface mount components 85 and 86 on the circuit board 71, the antenna device 101 is able to be easily mounted inside the housing 91.

The transmission line unit SL of the antenna device 101 according to the present preferred embodiment preferably has a triplate stripline structure in which the signal conductor 31 is sandwiched between the second ground conductors 21 and 22. Therefore, in the electronic apparatus according to the present preferred embodiment, the shielding effect of the second ground conductors 21 and 22 is able to significantly reduce or prevent undesired coupling between the signal conductor 31 and the conductor on the circuit board 71. It is thus possible to significantly reduce or prevent changes in characteristics.

In the antenna device 101 according to the present preferred embodiment, the second ground conductor 22 that partially defines the matching circuit unit IM and the transmission line unit SL is electrically connected to the first ground conductor 92 on the housing 91. Therefore, the ground potential of the second ground conductor 22 is able to be stabilized. It is thus possible to significantly reduce or prevent changes in characteristics in the matching circuit unit IM, and to enhance the shielding effect in the transmission line unit SL.

In the antenna device 101 according to the present preferred embodiment, the entire substrate 10 is flexible. Therefore, the antenna device 101 does not need to be designed to fit the shape of the inner surface of the housing 91, and is able to be easily placed along the inner surface of the housing 91.

The term "vicinity" of the connecting portion in the preferred embodiments of the present invention refers not only to a location very close to the connecting portion CN (connector 61) of the transmission line unit SL. For example, a location at a distance of less than three times the distance D between the inner surface of the housing 91 and the circuit board 71 (that is, at a distance of less than 3*D) from the connecting portion CN (connector 61) is referred to as the "vicinity" of the connecting portion.

The configuration of the ground connection portion 47 of the matching circuit unit IM is not limited to the specific configuration described in the present preferred embodiment. The shape, quantity, and size or the like, of the ground connection portion 47 are able to be appropriately changed. That is, the ground connection portion 47 may be provided on the entire matching circuit unit IM in the region CA, on the first principal surface VS1 of the substrate 10.

Although the present preferred embodiment describes a configuration where the entire substrate 10 of the antenna device 101 is flexible, the configuration of the substrate 10 is not limited to this specific configuration, and the substrate 10 may be only partly flexible. In the electronic apparatus according to the present preferred embodiment, it is only necessary that the substrate 10 be flexible at least in the vicinity of the connector 61 (connecting portion CN). It is preferable that the substrate 10 be flexible in an area where the antenna unit AN is disposed.

Although the present preferred embodiment describes the antenna device 101 in which the connector 61 (connecting portion CN) is disposed on the second principal surface VS2 of the substrate 10, the configuration of the antenna device 101 is not limited to this specific configuration. The connector 61 (connecting portion CN) may be disposed on the first principal surface VS1 of the substrate 10, attached to the inner surface of the housing 91. In this case, the connector 61 is connected to the receptacle 62 in which the transmission line unit SL having flexibility is bent, and the first principal surface VS1 of the substrate 10 faces a surface of the circuit board 71. Therefore, receptacle 62 (the circuit of the circuit board 71) and the connector 61 face each other. According to this configuration, the connector 61 (connecting portion CN) is able to be connected to receptacle 62 (the circuit of the circuit board 71).

Second Preferred Embodiment

Figure 7:
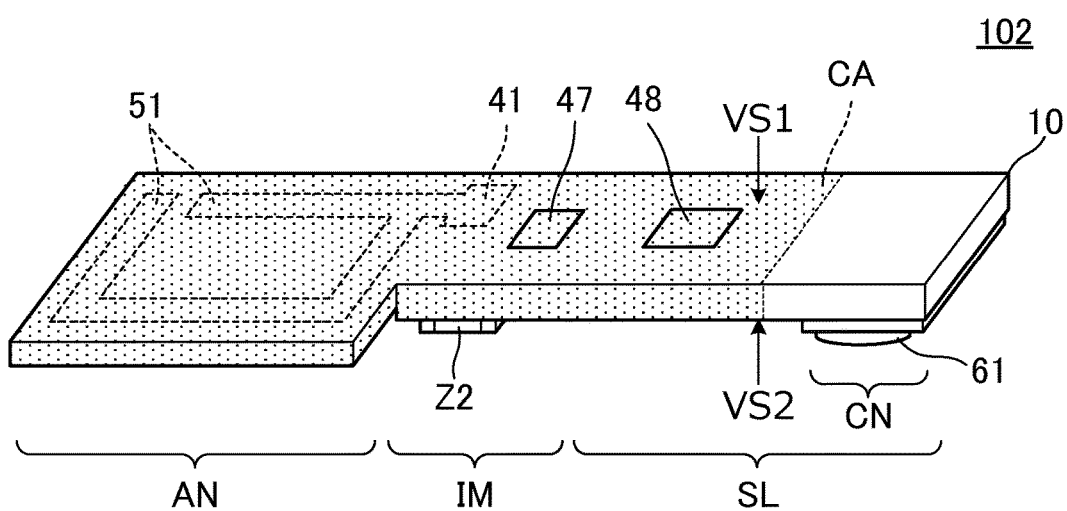
FIG. 7 is an external perspective view of an antenna device 102 according to a second preferred embodiment of the present invention.
Figure 8:
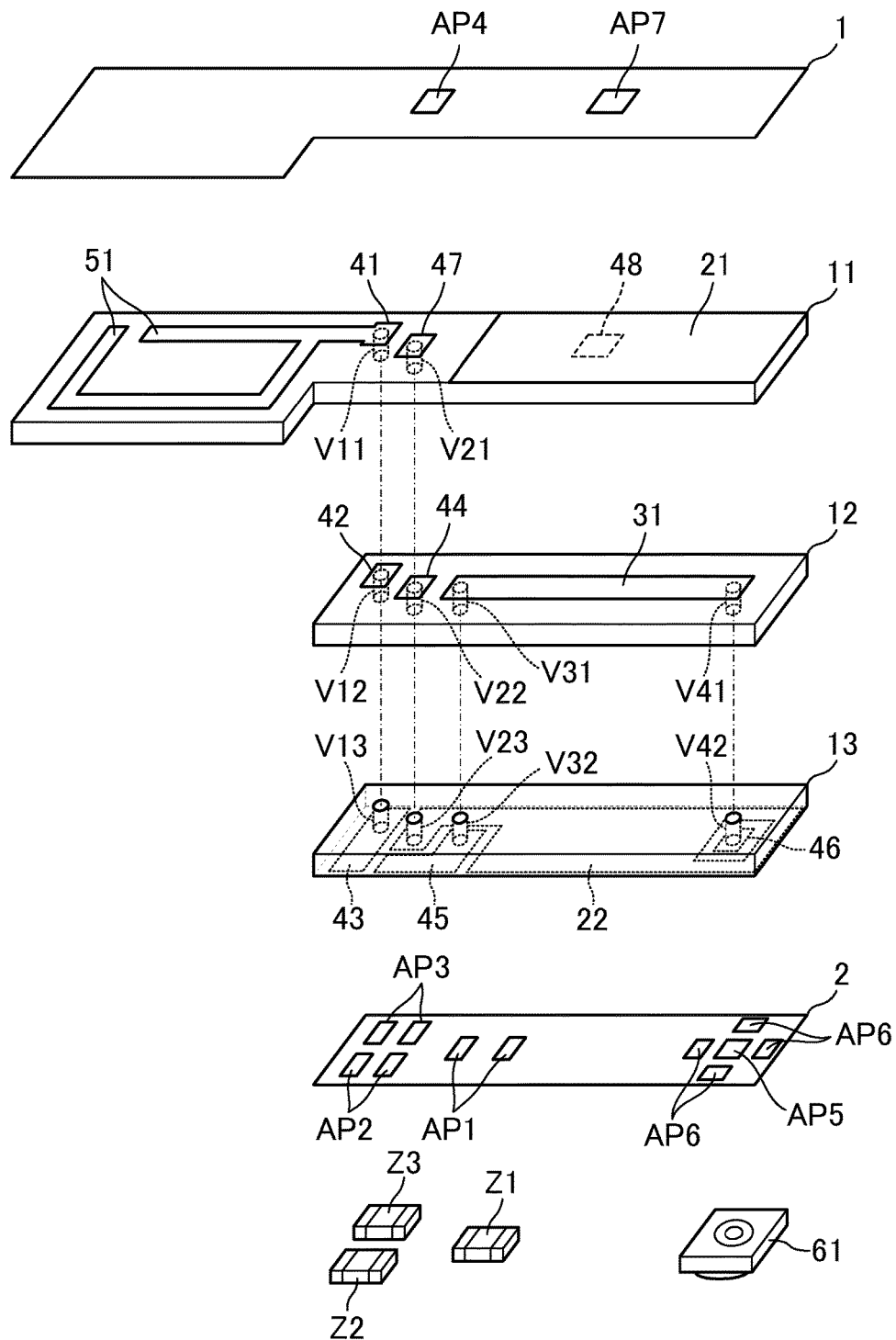
FIG. 8 is an exploded perspective view of the antenna device 102 according to the second preferred embodiment of the present invention.
Figure 9:
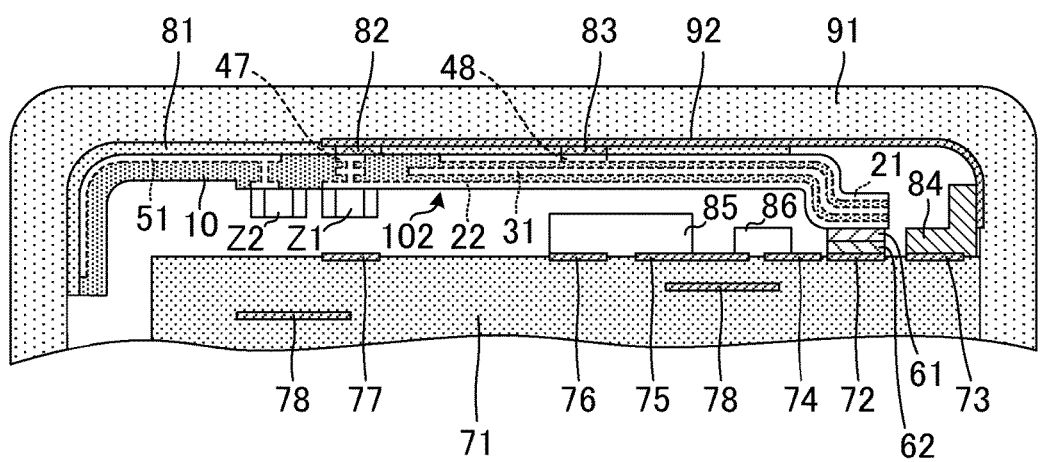
FIG. 9 is a cross-sectional view of a main portion of an electronic apparatus according to the second preferred embodiment of the present invention.

FIG. 7 is an external perspective view of an antenna device 102 according to a second preferred embodiment of the present invention. FIG. 8 is an exploded perspective view of the antenna device 102. FIG. 9 is a cross-sectional view of a main portion of an electronic apparatus according to the second preferred embodiment.

The antenna device 102 differs from the antenna device 101 according to the first preferred embodiment in that the transmission line unit SL includes a ground connection portion 48. The other features and elements of the present preferred embodiment are the same or substantially the same as those of the antenna device 101. The electronic apparatus according to the present preferred embodiment differs from the electronic apparatus according to the first preferred embodiment in that the ground connection portion 48 is connected to the first ground conductor 92 on the housing 91 by a conductive member 83. The other features and elements of the present preferred embodiment are the same or substantially the same as those of the electronic apparatus according to the first preferred embodiment.

The differences from the antenna device 101 and the electronic apparatus according to the first preferred embodiment are described below.

The protective layer 1 includes an opening AP7 corresponding to the position where the ground connection portion 48 is located. The opening AP7 preferably is rectangular or substantially rectangular in plan view, and is smaller in area than the second ground conductor 21. Therefore, the protective layer 1 is provided on the upper surface of the resin base layer 11, so that the ground connection portion 48, which is a portion of the second ground conductor 21, is exposed on the first principal surface VS1 of the substrate 10. Thus, the transmission line unit SL includes the ground connection portion 48 on the front surface of the region CA (shaded with dots in FIG. 7). As described below, the ground connection portion 48, which is a portion of the second ground conductor 21, is electrically connected to the first ground conductor 92 on the housing 91.

As shown in FIG. 9, in the electronic apparatus according to the present preferred embodiment, the first principal surface VS1 of the substrate 10 of the antenna device 102 is attached to the inner surface of the housing 91, with the adhesive member 81 and the conductive members 82 and 83 interposed therebetween. Specifically, the ground connection portion 48 exposed on the first principal surface VS1 of the substrate 10 is connected to the first ground conductor 92 on the housing 91 with the conductive member 83. That is, the ground connection portion 48 (second ground conductor 21) is electrically connected to the first ground conductor 92. The conductive member 83 is, for example, conductive double-sided tape, but solder or conductive joint material may be provided as the conductive member 83.

The electronic apparatus according to the present preferred embodiment includes basically the same configuration as the electronic apparatus according to the first preferred embodiment, and provides advantageous effects similar to those of the electronic apparatus according to the first preferred embodiment.

In the antenna device 102 according to the present preferred embodiment, the second ground conductor 21 (ground connection portion 48) that partially defines the transmission line unit SL is electrically connected to the first ground conductor 92 on the housing 91. Therefore, the ground potential of the second ground conductor 21 is able to be stabilized. Thus, a higher shielding effect in the transmission line unit SL is able to be provided than the shielding effect in the transmission line unit SL in the antenna device 101 of the first preferred embodiment. That is, an antenna device preferably includes ground connection portions on the surfaces of both the matching circuit unit IM and the transmission line unit SL in the region CA. The configuration of the antenna device is not limited to this specific configuration, and the antenna device may include a ground connection portion on the surface of only the transmission line unit SL in the region CA.

The configuration of the ground connection portion 48 of the transmission line unit SL is not limited to the specific configuration described in the present preferred embodiment. The shape, quantity, and size or the like, of the ground connection portion 48 is able to be appropriately changed. That is, the ground connection portion 48 may be provided on the entire transmission line unit SL in the region CA, on the first principal surface VS1 of the substrate 10.

Third Preferred Embodiment

Figure 10:
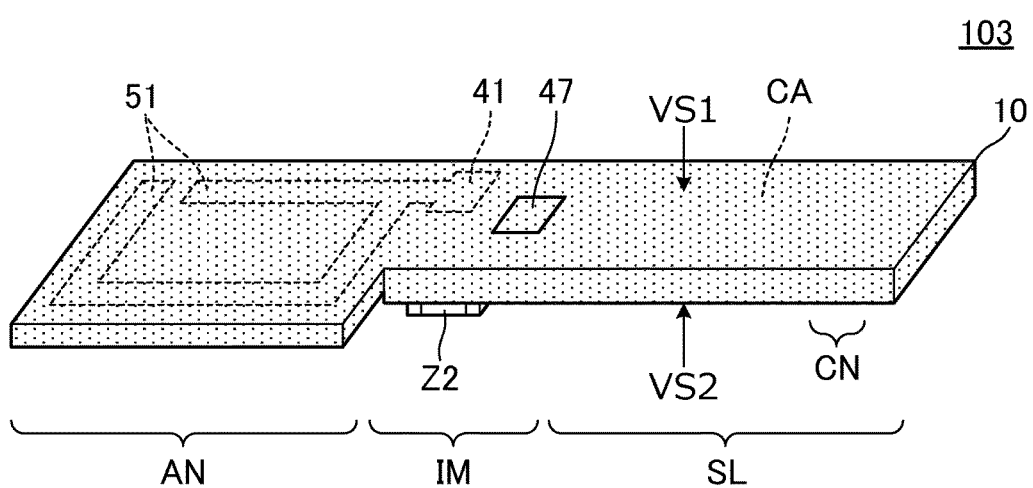
FIG. 10 is an external perspective view of an antenna device 103 according to a third preferred embodiment of the present invention.
Figure 11:
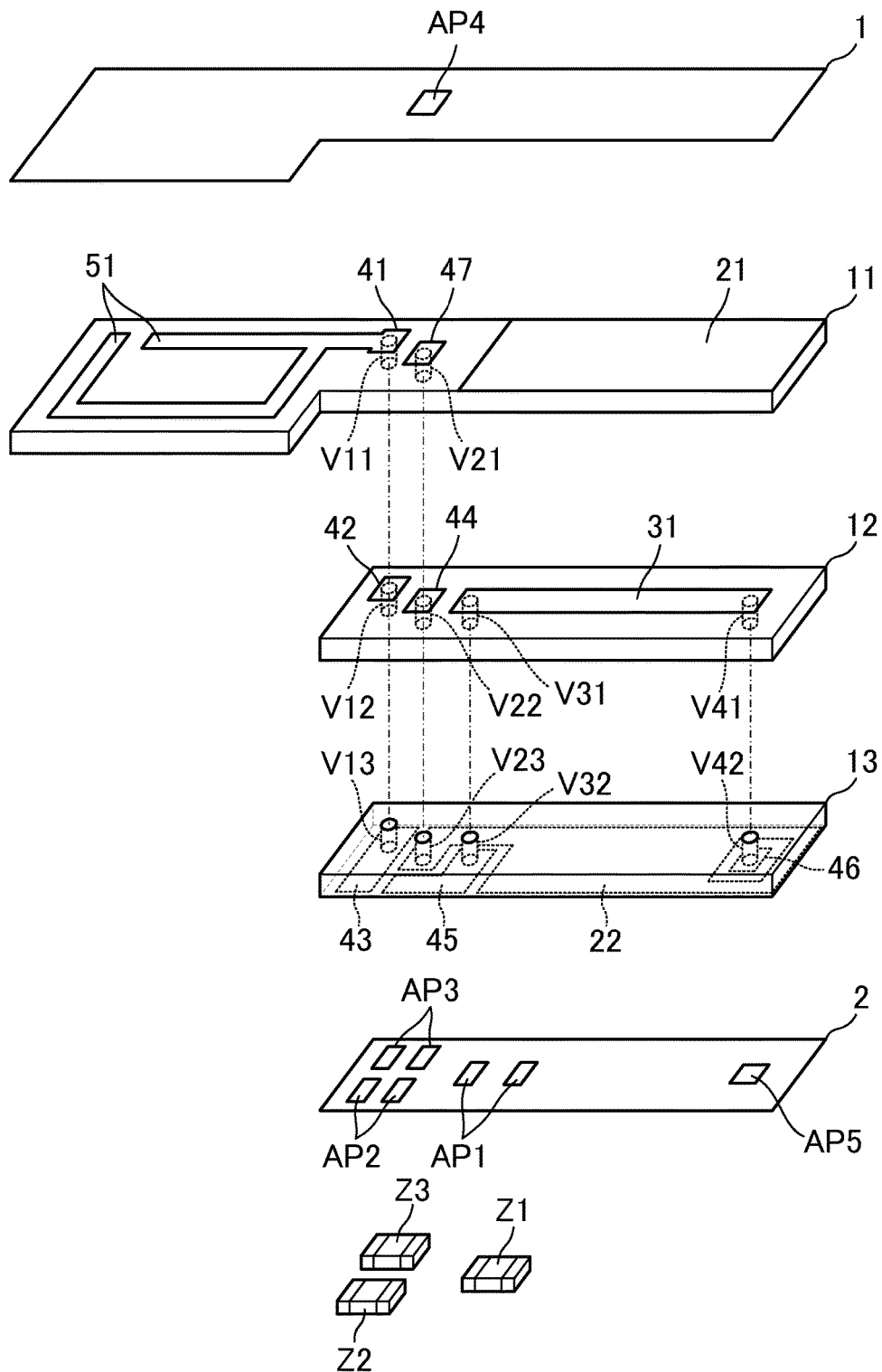
FIG. 11 is an exploded perspective view of the antenna device 103 according to the third preferred embodiment of the present invention.
Figure 12:
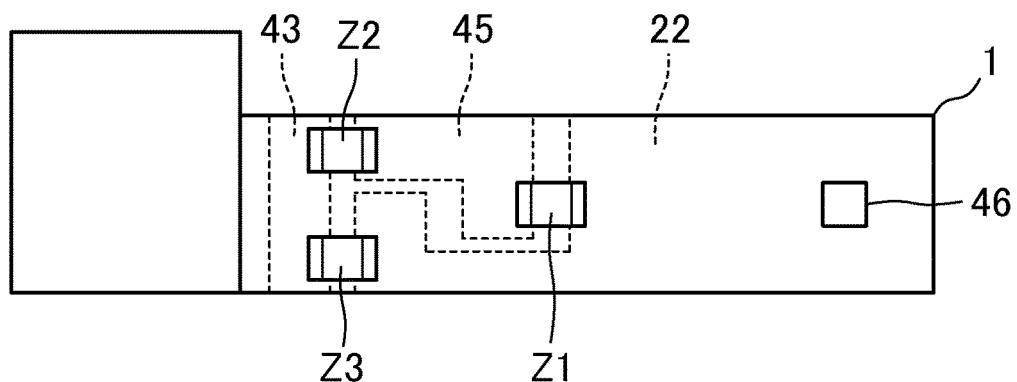
FIG. 12 shows a back side of the antenna device 103 according to the third preferred embodiment of the present invention.
Figure 13:
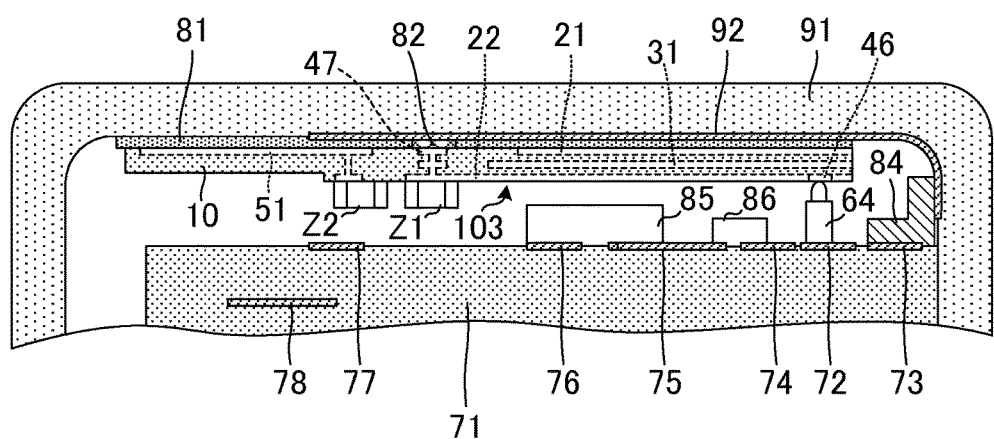
FIG. 13 is a cross-sectional view of a main portion of an electronic apparatus according to the third preferred embodiment of the present invention.

FIG. 10 is an external perspective view of an antenna device 103 according to a third preferred embodiment of the present invention. FIG. 11 is an exploded perspective view of the antenna device 103. FIG. 12 shows a back side of the antenna device 103. FIG. 13 is a cross-sectional view of a main portion of an electronic apparatus according to the third preferred embodiment.

The antenna device 103 differs from the antenna device 101 according to the first preferred embodiment in that the antenna device 103 does not include the connector 61. The other features and elements of the present preferred embodiment are the same or substantially the same as those of the antenna device 101. The electronic apparatus according to the present preferred embodiment differs from the electronic apparatus according to the first preferred embodiment in that the conductor 72 on the circuit board 71 is connected to the connecting portion by a connecting member 64. Also, the electronic apparatus according to the present preferred embodiment differs from the electronic apparatus according to the first preferred embodiment in that the antenna unit (antenna conductor 51) is placed in a flat or substantially flat state along the inner surface of the housing 91. The other features and elements of the present preferred embodiment are the same or substantially the same as those of the electronic apparatus according to the first preferred embodiment.

The differences from the antenna device 101 and the electronic apparatus according to the first preferred embodiment are described below.

As described above, the antenna device 103 includes no connector, and the protective layer 2 does not include the openings AP6. The protective layer 2 is provided on the lower surface of the resin base layer 13, so that the connection electrode 46 is exposed on the second principal surface VS2 of the substrate 10. In the present preferred embodiment, the connection electrode 46 defines a "connecting portion". Note that the second ground conductor 22 of the antenna device 103 may be connected to a ground conductor on the circuit board 71 by a connection terminal. Since the second ground conductor 22 is electrically connected to the ground conductor on the circuit board 71, the ground potential of the second ground conductor 22 is stabilized.

As shown in FIG. 13, in the electronic apparatus according to the present preferred embodiment, the first principal surface VS1 of the substrate 10 of the antenna device 103 is attached to the inner surface of the housing 91, with the adhesive member 81 and the conductive member 82 interposed therebetween. As described above, the antenna unit AN (antenna conductor 51) of the antenna device 103 is arranged in a flat state along the inner surface of the housing 91. According to the arrangement of antenna device 103, the entire first principal surface VS1 of the substrate 10 extends along the inner surface of the housing 91.

The connecting member 64 is disposed on the conductor 72, which is provided on the circuit board 71. The connecting member 64 is a mount component electrically connected to the conductor 72, with a conductive joint material (not shown) interposed therebetween. The connecting member is, for example, a spring pin. The connecting member 64 is in contact with the connection electrode 46. The conductor 72 on the circuit board 71 and the connection electrode 46 are thus connected by the connecting member 64.

The electronic apparatus according to the present preferred embodiment includes basically the same configuration as the electronic apparatus according to the first preferred embodiment, and provides advantageous effects similar to those of the electronic apparatus according to the first preferred embodiment.

As described in the present preferred embodiment, a connector is not an essential component.

In the electronic apparatus according to the present preferred embodiment, the conductor 72 on the circuit board 71 is connected to the transmission line unit SL by the spring pin (the connecting member 64). As compared to the case where the conductor (conductor 79 in FIG. 6) on the circuit board 71 is connected to the antenna unit AN (antenna conductor 51) by the connecting member, the spring pin (connecting member 64) has less impact to the antenna conductor 51 and degradation of antenna characteristics is able to be significantly reduced or prevented. Since the connecting member 64 and the antenna conductor 51 are spaced apart (that is, not close to each other), stray capacitance between the connecting member 64 and the antenna conductor 51 is able to be significantly reduced or prevented. Therefore, degradation of antenna characteristics is able to thus be significantly reduced or prevented.

In the electronic apparatus according to the present preferred embodiment, the entire antenna device 103 is in the region CA (shaded with dots in FIG. 10) and is disposed along the inner surface of the housing 91. The antenna device 103 is connected to the circuit board 71 (for example, to the conductor 72 on the circuit board 71) only at the connection electrode 46. In the present preferred embodiment, where the transmission line unit SL is not bent in the vicinity of the connection electrode 46 (connecting portion), the entire transmission line unit SL is spaced apart from the circuit board 71. Therefore, as compared to the electronic apparatus according to either of the preferred embodiments described above, interference to the circuit board 71, for example, radiation or the like, of noise from the transmission line unit SL or the like, is able to be further significantly reduced or prevented.

In the electronic apparatus according to the present preferred embodiment, the circuit of the circuit board 71 is connected to the connection electrode 46 (connecting portion CN) simply by the connecting member 64 electrically connected to the conductor 72 being in contact with the connection electrode 46 (connecting portion CN). Thus, the connection between these components is able to be made more easily than that in the electronic apparatus according to either of the preferred embodiments described above.

When an antenna device is attached on the flat inner surface of the housing 91 as in the present preferred embodiment, the substrate 10 of the antenna device does not necessarily need to be flexible.

Other Preferred Embodiments

Although the substrate 10 preferably is a substantially long, flat plate in the preferred embodiments described above, the configuration of the substrate 10 is not limited to this specific configuration. The shape of the substrate 10 (antenna device) in plan view may be appropriately changed, as long as the advantageous effects described above are able to be achieved.

Although the substrate 10 preferably is a multilayer body including the resin base layers 11, 12, and 13 in the preferred embodiments described above, the configuration of the substrate 10 is not limited to this specific configuration. The number of resin base layers included in the substrate 10 may be changed appropriately. The substrate 10 does not necessarily need to be a multilayer body including a plurality of resin base layers, and may be defined by a single insulating base member.

In the electronic apparatus according to any of the preferred embodiments described above, the first principal surface VS1 of the substrate 10 is substantially entirely attached on the inner surface of the housing 91. However, the configuration is not limited to this specific configuration. The first principal surface VS1 of the substrate 10 may be only partly attached on the inner surface of the housing 91.

In the electronic apparatus according to any of the preferred embodiments described above, substantially the entire antenna device is in the region CA and is disposed along the inner surface of the housing 91. However, the configuration is not limited to this specific configuration, and the antenna device may be only partly disposed along the inner surface of the housing 91. For example, to significantly reduce or prevent stray capacitance generated between the antenna conductor 51 and the conductor on the circuit board 71, it is only necessary that the antenna unit AN be disposed along the inner surface of the housing 91. Also, to significantly reduce or prevent radiation of noise from the transmission line unit SL to the circuit board 71, it is only necessary that the transmission line unit SL be disposed along the inner surface of the housing 91.

Although the first ground conductor 92 preferably is provided on the inner surface of the housing 91 of resin in the preferred embodiments described above, the configuration of the housing 91 is not limited to this specific configuration. The housing 91 may include a conductive unit (metal housing portion) that defines and functions as a ground and an insulating unit (insulating housing portion). It is preferable, in this case, that the antenna unit AN be disposed along the inner surface of the insulating unit of the housing 91.

Although the antenna conductor 51 is a C-shaped or substantially C-shaped conductive pattern in the preferred embodiments described above, the configuration of the antenna conductor 51 is not limited to this specific configuration. The shape of the antenna conductor 51 in plan view may be appropriately changed, as long as the antenna conductor 51 is able to define a radiating element of the antenna. The structure of the antenna unit AN is not limited to a structure defined by a conductive pattern. The communication frequency band is not limited to a UHF band.

Although the matching circuit unit IM preferably is a π-shaped or substantially π-shaped circuit including the reactance elements Z1, Z2, and Z3 in the preferred embodiments described above, the configuration of the matching circuit unit IM is not limited to this specific configuration and may be appropriately changed. For example, the matching circuit unit IM may be a T-shaped or substantially T-shaped circuit. The number, type, and reactance value or the like, of the reactance elements Z1, Z2, and Z3 may be appropriately changed within ranges required to achieve impedance matching between the feed circuit and the antenna unit AN and to set the antenna frequency characteristics.

Although the matching circuit unit IM includes the reactance elements Z1, Z2, and Z3 in the preferred embodiments described above, the configuration of the matching circuit unit IM is not limited to this specific configuration. An inductor and a capacitor defined by a conductive pattern may be combined to form the matching circuit unit IM.

In the preferred embodiments described above, the transmission line unit SL of the antenna device preferably has a triplate stripline structure in which the signal conductor 31 is sandwiched between the second ground conductors 21 and 22. However, the configuration of the transmission line unit SL is not limited to this specific configuration. The transmission line unit SL may have a microstrip line structure including one second ground conductor and the signal conductor 31, or may have a coplanar line structure. The transmission line unit SL does not necessarily need to include the second ground conductor, and may be formed only by the signal conductor 31.

Although the signal conductor 31 is a conductive pattern extending along the longitudinal direction of the substrate 10 (resin base layer 12) in the preferred embodiments described above, the configuration of the signal conductor 31 is not limited to this specific configuration. The direction in which the signal conductor 31 extends with respect to the substrate 10 may be appropriately changed. Although the transmission line unit SL extends in the longitudinal direction of the substrate 10 in the preferred embodiments described above, the configuration of the transmission line unit SL is not limited to this specific configuration. The transmission line unit SL does not necessarily need to have a linear shape extending in the longitudinal direction of the substrate 10, and may be appropriately changed in shape.

In the preferred embodiments described above, the connecting portion CN (connector 61 or connection electrode 46) preferably is disposed near an end portion of the substrate 10 in the longitudinal direction (for example, near an end portion of the transmission line unit SL). However, the configuration of the connecting portion CN is not limited to this specific configuration. The connecting portion CN may be appropriately changed in location, and may be disposed in the center of the transmission line unit SL.

Although the transmission line unit SL preferably is bent in the vicinity of the connecting portion CN (connector 61 or connection electrode 46) in the first and second preferred embodiments described above, the configuration is not limited to this specific configuration. As described above, however, the antenna device preferably has a structure in which the transmission line unit SL is bent in the vicinity of the connecting portion CN.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic apparatus comprising:
an antenna device;
a circuit board including a circuit; and
a housing containing the antenna device and the circuit board; wherein
an inner surface of the housing and the circuit board are spaced from each other by a distance;
the housing includes a first ground conductor;
the antenna device includes:
an antenna unit;
a matching circuit unit connected to the antenna unit;
a transmission line unit connected to the matching circuit unit; and
a connecting portion included in the transmission line unit and connected to the circuit of the circuit board;
the antenna unit, the matching circuit unit, the transmission line unit, and the connecting portion are disposed in a single substrate;
the antenna device is at least partly disposed along the inner surface of the housing;
at least one of the matching circuit unit and the transmission line unit includes a second ground conductor, and includes a ground connection portion at least in a portion of a surface of a region where the antenna device is disposed along the inner surface of the housing; and
the ground connection portion electrically connects the second ground conductor to the first ground conductor.

2. The electronic apparatus according to claim 1, wherein an entirety of the substrate is flexible.

3. The electronic apparatus according to claim 1, wherein the substrate is flexible at least in an area where the antenna unit is disposed; and
the antenna unit is located along the inner surface of the housing in a bent state.

4. The electronic apparatus according to claim 1, wherein the substrate is flexible at least in a vicinity of the connecting portion; and
the transmission line unit is bent in the vicinity of the connecting portion.

5. The electronic apparatus according to claim 4, wherein a vicinity of the connecting portion is within a distance of less than three times the distance between the inner surface of the housing and the circuit board.

6. The electronic apparatus according to claim 1, wherein the antenna device is disposed along the inner surface of the housing, except in a vicinity of the connecting portion, and is connected to the circuit only at the connecting portion.

7. The electronic apparatus according to claim 6, wherein a vicinity of the connecting portion is within a distance of less than three times the distance between the inner surface of the housing and the circuit board.

8. The electronic apparatus according to claim 1, wherein the ground connection portion is exposed on a first principal surface of the substrate.

9. The electronic apparatus according to claim 1, wherein the matching circuit unit is a π-shaped or substantially π-shaped circuit including at least one reactance element.

10. The electronic apparatus according to claim 9, wherein the at least one reactance element is mounted on a second principal surface of the substrate.

11. The electronic apparatus according to claim 1, wherein
the portion of the second ground conductor is exposed on a second principal surface of the substrate.

12. The electronic apparatus according to claim 1, wherein the substrate has a multilayer structure including a first protective layer defining an uppermost layer, at least one resin base layer defining at least one center layer, and a second protective layer defining a lowermost layer.

13. The electronic apparatus according to claim 12, wherein the at least one resin base layer is a resin layer, and the first and second protective layers are resist layers or coverlay films.

14. The electronic apparatus according to claim 12, wherein the antenna unit includes an antenna conductor that includes a C-shaped or substantially C-shaped conductive pattern near a second end portion of the at least one resin base layer.

15. The electronic apparatus according to claim 1, wherein the antenna unit, the matching circuit unit, the transmission line unit, and the connecting portion are arranged in this order in a longitudinal direction of the substrate.

16. The electronic apparatus according to claim 1, wherein
the second ground conductor includes two second ground conductors; and
the transmission line unit has a triplate stripline structure in which a signal conductor is sandwiched between the two second ground conductors.

17. The electronic apparatus according to claim 1, wherein at least one surface mount component is mounted on a principal surface of the circuit board.

18. The electronic apparatus according to claim 17, wherein
at least one conductor is provided on the principal surface of the circuit board; and
each of the at least one conductor is a conductive pattern that is connected to a respective one of the at least one surface mount component.

19. The electronic apparatus according to claim 1, wherein
an entire first principal surface of the substrate extends along the inner surface of the housing.

* * * * *